United States Patent [19]

Lu

[11] Patent Number: 6,083,069
[45] Date of Patent: Jul. 4, 2000

[54] METHOD OF MAKING A MICRO VACUUM TUBE WITH A MOLDED EMITTER TIP

[75] Inventor: Nai-Cheng Lu, Hsin-Chu, Taiwan

[73] Assignee: Taiwan Semiconductor Manufacturing Company, Hsin-Chu, Taiwan

[21] Appl. No.: 09/108,414

[22] Filed: Jul. 1, 1998

[51] Int. Cl.[7] ........................................ H01J 9/02
[52] U.S. Cl. .................................. 445/24; 445/50
[58] Field of Search ........................... 445/24, 50

[56] References Cited

U.S. PATENT DOCUMENTS

| | | | |
|---|---|---|---|
| 5,266,530 | 11/1993 | Bagley et al. | 437/228 |
| 5,569,973 | 10/1996 | Zimmerman | 313/309 |
| 5,576,986 | 11/1996 | Matsuzaki et al. | 365/129 |
| 5,795,208 | 8/1998 | Hattori | 445/24 |

Primary Examiner—Kenneth J. Ramsey
Attorney, Agent, or Firm—George O. Saile; Stephen B. Ackerman

[57] ABSTRACT

A micro vacuum tube is described. The process for manufacturing it begins with the deposition of two layers of polysilicon or metal, separated by dielectric layers, topping them with a layer of silicon nitride, and forming these into the shape of a disk. A hole is etched in the silicon nitride and then lined with a spacer, causing the width of the hole to decrease from top to bottom. When the hole is partially filled with a sacrificial layer the latter has a depression at its center which may be used as a mold for a microtip. To allow for easy removal of the sacrificial layer, pole holes are etched in it. These become support poles after the microtip material has been deposited over the sacrificial layer (which gets removed in its entirety). As an alternative to a microtip, a micro razor edge may be used for the cold emitter. A cap deposited over the structure while it is in vacuo serves to keep it under permanent vacuum.

15 Claims, 4 Drawing Sheets

METHOD OF MAKING A MICRO VACUUM TUBE WITH A MOLDED EMITTER TIP

FIELD OF THE INVENTION

The invention relates to the general field of microelectronics with particular reference to vacuum tubes compatible with integrated circuits.

BACKGROUND OF THE INVENTION

Once semiconductor integrated circuits became practical in the late 1960s, transistors took over from vacuum tubes in almost all areas except very high power. Major reasons for this were the requirement of a permanently powered hot filament as a source of electrons, the need to reduce the device's size for operation at high frequencies, and a technology that did not lend itself to extensive miniaturization.

In response to the industry's need for a more efficient display technology than liquid crystals or light emitting diodes, extensive work has been done on the phenomenon of cold cathode emission. Cold cathode, or field emission, devices are based on the phenomenon of high field emission wherein electrons can be emitted into a vacuum from a room temperature source if the local electric field at the surface in question is high enough. The creation of such high local electric fields does not necessarily require the application of very high voltage, provided the emitting surface has a sufficiently small radius of curvature.

Usually, cold cathode field emission devices are mass produced as an array of very small conical emitters, each of which is connected to a source of negative voltage via a cathode conductor line. Another set of conductive lines (called gate lines) is located a short distance above the cathode lines, intersecting with them at the locations of the conical emitters or microtips, and connected to a source of positive voltage. Both the cathode and the gate line that relate to a particular micro-tip must be activated before there will be sufficient voltage to cause cold cathode emission.

The electrons that are emitted by the cold cathodes accelerate past openings in the gate lines and are collected at an anode surface. In displays, the anodes are made of a luminescent material but if the anode is simply a collector, the device becomes a triode vacuum tube. Note that, even though the local electric field in the immediate vicinity of a microtip is in excess of 10 million volts/cm., the externally applied voltage is only of the order of several volts.

In a display, the above described components would normally be housed in a flat, vacuum tight, structure consisting of a front anode plate, a rear plate that bears the microtips as well as the power (cathode and gate) lines, separated from one another by side supports, located at their edges. Spacers, located between groups of microtips, are also often provided for added strength.

When field emission devices are to be used as vacuum tubes, the package described above is no longer needed since each micro vacuum tube can be individually sealed in its own vacuum environment. Nor need they be laid out in array form if other layouts are more efficient.

Micro vacuum tubes, of the general type described above, offer a number of advantages over transistors. These include:
  there is zero leakage current when they are turned off (as opposed to the small, but finite, leakage of a back-biassed PN junction);
  they are not subject to hot electron effects which occur in MOS devices because of trapped charges;
  they are capable of operating at higher frequencies than transistors since there is no parasitic junction capacitance; and
  they have more linear IV curves than do MOS devices.

Before micro vacuum tubes can replace, or even co-exist with, transistors in integrated circuits, several problems still need to be overcome. These include accurate alignment of the microtip and the gate electrode, achievement of which would allow the use of narrower gate necks (offering better control), improving the emission efficiencies of the microtips, and making their manufacture fully compatible with integrated circuit manufacturing technology.

As will be described below, improved alignment of the emitting source relative to the gate electrode can be achieved by making the latter self-aligning. Before describing the improvements in emitter efficiency that result from the present invention, it is worth reviewing how microtips are currently manufactured. The most widely used method involves first forming a cavity that contains a cathode layer at one end and a gate electrode at the other, there being a small opening in the latter. By rotating this structure while a stream of evaporant is directed at it at an angle, a conical microtip is formed on the cathode layer inside the cavity, with its apex being level with the gate electrode opening. In practice the microtip and the opening are fused together and have to be etched back to separate them.

An alternative to the above method has been the use of a mold to form the microtip. Such a mold is readily formed if a conformal deposition method is used to partially fill a hole whose depth exceeds its diameter and that has curved walls i.e. the diameter of the hole is a maximum at its top and a minimum at its bottom. As deposition proceeds, the diameter of the hole gradually decreases until the coatings on opposite sides at the bottom of the hole meet. If deposition is stopped before the hole fills up, a concave cusp will have formed inside the hole. When such a mold is filled with some other material a convex cusp, well suited to be a cold cathode emitter, is the result.

In macro technology, the next step would be the extraction of the molded part followed by its suitable placement. In micro technology this is not possible. Instead, the molded part is left in place and the mold is selectively etched away (sacrificed). Two key problems that must always be solved are how to access the mold (since it is often totally covered by the part) and how to leave the part firmly secured in the right place once the mold has been removed.

One solution to said key problems is presented by Zimmerman U.S. Pat. No. 5,569,973 Oct 1996). Access holes to the sacrificial layer are etched through the microtip. These are located quite close to the actual tip to make sure that all sacrificial material near it gets removed. Etching of the sacrificial layer is very carefully controlled since all of it is not removed, the portion that is left behind after etching becoming the support for the microtip.

A third method for forming microtips is described by Bagley et al. U.S. Pat. No. 5,266,530 Nov 1993). A pedestal is etched using a mask in the usual way except that substantial overetching is allowed to take place. This leads to severe undercutting of the pedestal's top, giving it the shape of a cone. Anodic etching is then used to further sharpen the tip. This method results in a self-aligned gate electrode but could not be used to form a structure having additional self-aligned gates.

Of interest also is Matsuzaki et al. U.S. Pat. No. 5,576,986 Nov 1996) who describe a micro vacuum tube having a recess formed out of silicon oxide and a cold cathode emitter that has many combtooth-like tips.

SUMMARY OF THE INVENTION

It has been an object of the present invention to provide a micro vacuum tube that is reliable, reproducible, and easy to manufacture.

Another object of the invention has been that said micro vacuum tube have a self aligned gate.

A still further object has been to provide a cold emitter for said vacuum tube that is a microtip or a micro razor edge.

Yet another object has been to provide processes to enable the manufacture of the above structures.

These objects have been achieved by depositing two layers of polysilicon, separated by dielectric layers, topped with a layer of silicon nitride, and forming these into the shape of a disk. A hole is etched in the silicon nitride and then lined with a spacer, causing the width of the hole to decrease from top to bottom. When the hole is partially filled with a sacrificial layer the latter has a depression at its center which may be used as a mold for a microtip. To allow for easy removal of the sacrificial layer, pole holes are etched in it. These become support poles when the microtip material is deposited over the sacrificial layer which then gets removed in its entirety. As an alternative to a microtip, a micro razor edge may be used for the cold emitter. A cap deposited over the structure while it is in vacuo serves to keep it under permanent vacuum.

BRIEF DESCRIPTION OF THE DRAWINGS

FIG. 5 is a plan view of which FIG. 4 is a cross-section.

DESCRIPTION OF THE PREFERRED EMBODIMENTS

The present invention describes a novel structure for a micro vacuum tube, as well as a process for manufacturing same. We will begin with a description of the general process. This will also make the details of the structure apparent.

Figure 1:
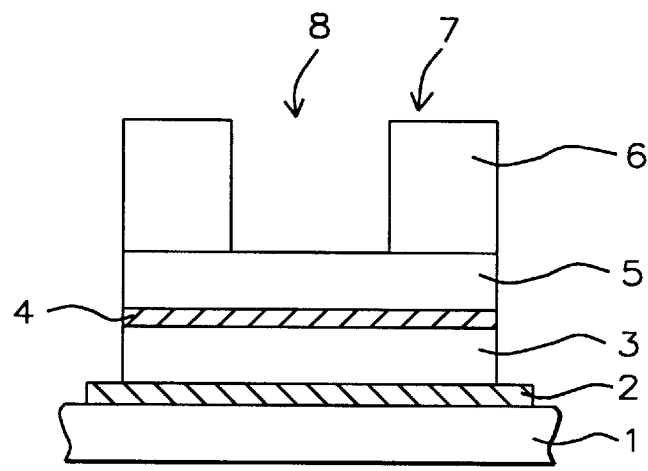
FIG. 1 shows a silicon nitride disk, with a hole down the center, resting on alternating layers of a dielectric and poly-silicon.

Referring now to FIG. 1, we show, in schematic cross-section, a substrate 1 whose nature and dimensions are not critical to the invention although in most cases it will be a part of a silicon integrated circuit. A polysilicon layer has been deposited onto substrate 1 and then patterned (using photolithography) and etched to form a first disk 2 whose thickness is between about 0.1 and 0.15 microns and whose diameter is between about 1.8 and 2 microns. The polysilicon used throughout the process, including forming disk 2, should preferably be heavily doped in order to reduce its resistivity.

In succession, dielectric layer 3 of PECVD (plasma enhanced chemical vapor deposition) oxide, between about 0.15 and 0.16 microns thick, polysicon layer 4, between about 550 and 600 Angstroms thick, onto said first disk, dielectric layer 5 of PECVD oxide, between about 1,500 and 1,600 Angstroms thick, and silicon nitride layer 6, between about 5,000 and 5,500 Angstroms thick, are deposited over disk 2. Layers 3, 4, 5, and 6 are then patterned and etched to form disk 7 whose diameter is less than that of disk 2, being between about 1.5 and 1.6 microns.

A circular hole 8, centrally located around the axis of disk 7 and having a vertical wall, is then etched in the silicon nitride down as far as layer 5. The diameter of hole 8 is between about 0.45 and 0.5 microns.

Figure 2:
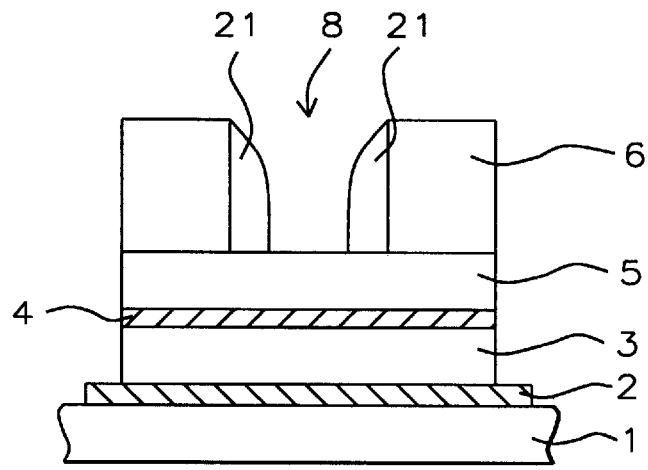
FIG. 2 shows a spacer deposited on the walls of the hole seen in FIG. 1.

Referring now to FIG. 2, a silicon nitride spacer is formed over the entire vertical wall of hole 8. A process for selectively leaving material only on vertical surfaces is used to form the spacer so the thickness of the spacer will vary from its maximum value (between about 0.5 and 1 microns) at the bottom of hole 8 to zero at the entrance to hole 8, giving the spacer's profile the curved appearance seen in FIG. 2.

Figure 3:
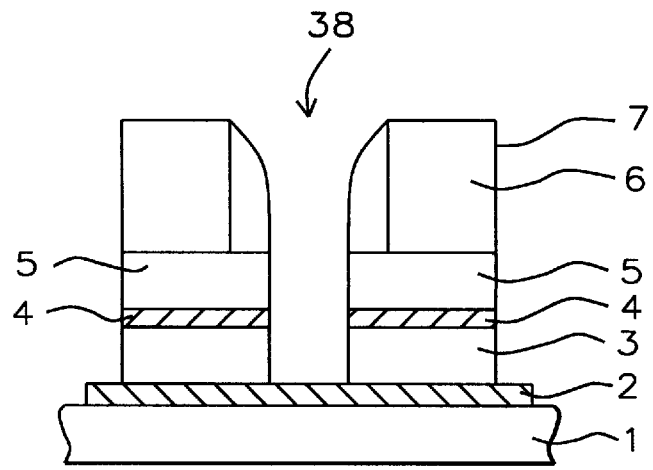
FIG. 3 shows the hole defined by the spacers extended down to the lowest layer of polysilicon.

Using the spacer 21 as a mask, hole 8 is extended down as far as polysilicon layer 2 by etching dielectric layers 3 and 5 as well as polysilicon layer 4, giving the structure the appearance shown in FIG. 3, the extended hole now being designated as hole 38.

Figure 4:
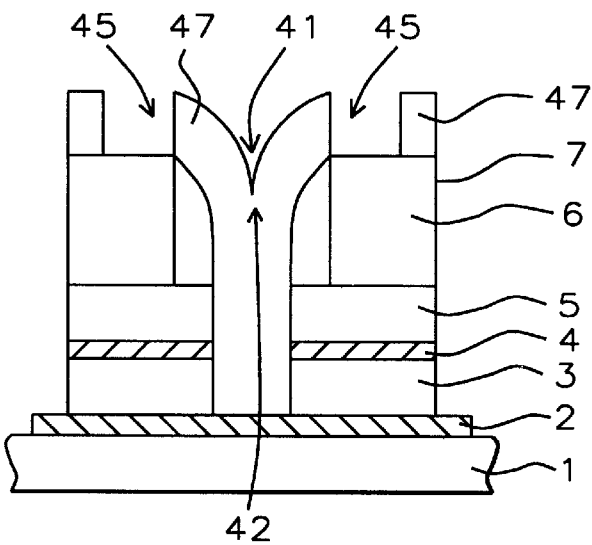
FIG. 4 illustrates how a sacrificial layer, deposited into the hole, produces a surface with a cusp shaped depression at it center.

Referring now to FIG. 4, using a conformal deposition method, a sacrificial layer 47 of SACVD (sub atmospheric chemical vapor deposition) oxide is deposited onto the top surface of layer 6 as well as into hole 38. Since the depth of 38 exceeds its diameter, material at the wall on opposite sides will meet when the thickness of 47 equals the radius of 38 (in practice between about 0.1 and 0.125 microns) resulting in the formation of concave cusp 41. The exact position of the cusp's apex 42 relative to layer 4 can be controlled through several variables including the thickness of 47, the profile of the spacer, the thickness of layer 6, and the thickness of layer 5.

The next step, which is a key feature of the invention, is to etch pole holes 45 through the sacrificial layer 47 down to the surface of silicon nitride layer 6. Hole 45 would typically have a diameter between about 0.35 and 0.4 microns. A plan view of the structure at this stage of the process is given in FIG. 5, FIG. 4 being a cross-section of FIG. 5 made at 4—4. Holes 45 are located between the depression formed by cusp 41 and the outer rim of disk 7.

Note that although the figures show two pole holes, the invention would still work if only a single pole hole is provided. Similarly, more pole holes could also be used, up to a practical maximum set by the amount of available space.

Figure 6:
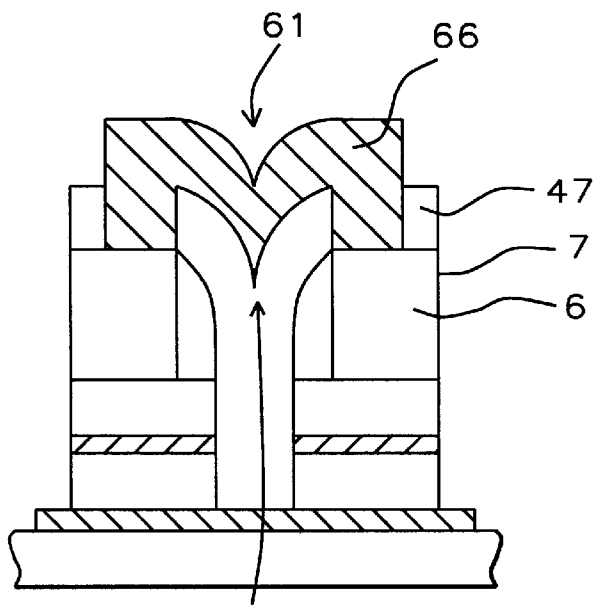
FIG. 6 illustrates how a microtip is formed when material is deposited over the sacrificial layer.

Referring now to FIG. 6, polysilicon layer 66 is deposited to a thickness sufficient to ensure that the pole holes are overfilled (between about 0.4 and 0.5 microns). Layer 66 is patterned and etched to form a disk having a diameter large enough to fully overlap the pole holes (by at least 1.5 microns) but less than the diameter of disk 7. Typically, the diameter of 66 would be between about 1.2 and 1.5 microns.

Figure 7:
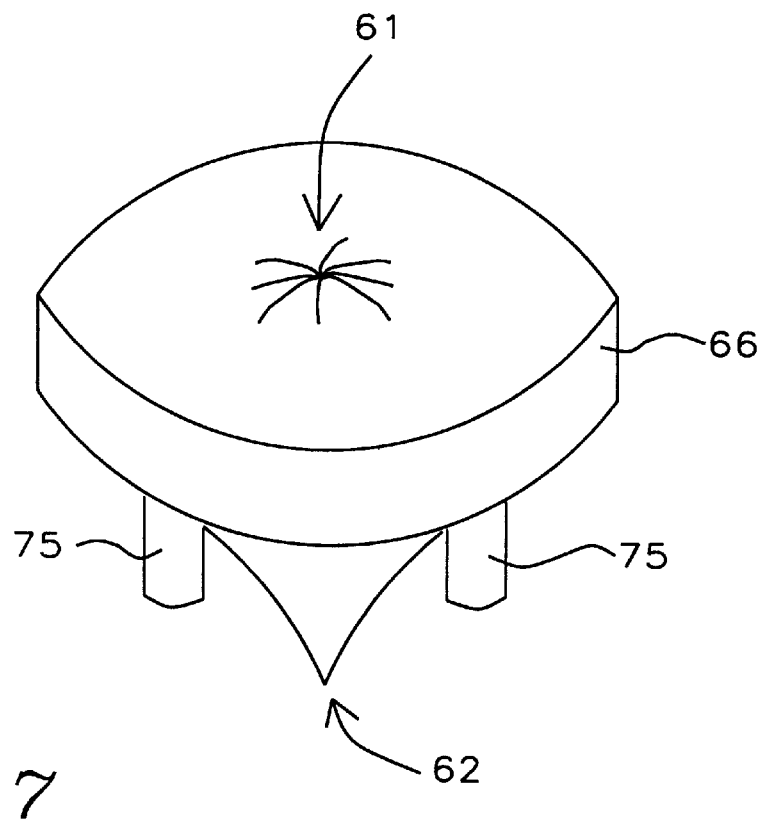
FIG. 7 is an isometric view of the cold emitter, including the microtip and the supporting poles.

Next, all of sacrificial layer 47 is removed using a selective etch such as 50:1 HF or BOE (buffered oxide etch) that does not attack the other materials in the structure. The result is the formation of the structure which is shown in an isometric view in FIG. 7. Microtip 62 is the convex cusp formed as a result of filling concave cusp 41. Supporting poles 75 are the result of filling pole holes 45.

Figure 8:
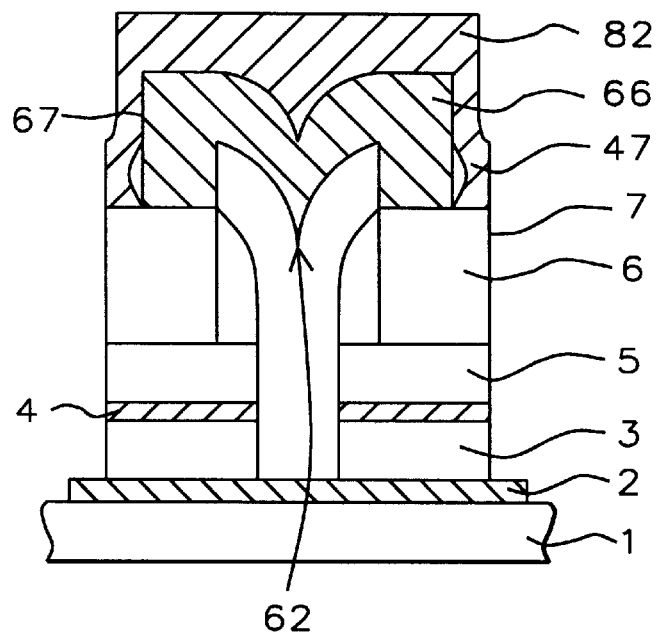
FIG. 8 shows a cross-section of the completed device and also illustrates how a vacuum may be sealed into it by the deposition of a suitable metal layer.

The micro vacuum tube is now essentially complete except for the step of sealing it in a permanent vacuum. The process for achieving this is illustrated in FIG. 8. In a vacuum of $10^{-6}$ torr, or better, metal layer 82 is deposited on the structure using a shadowing deposition method such as metal sputtering. Layer 82 could be titanium, titanium nitride, aluminum, copper, or similar metal and it is deposited to a thickness between about 0.15 and 0.17 microns. This is sufficient to bridge the gap between the rim of microtip-bearing disk 66 and the top surface of silicon nitride disk 7 and is also strong enough to withstand the external pressure of the atmosphere once the vacuum environment present during deposition is terminated.

Figure 9:
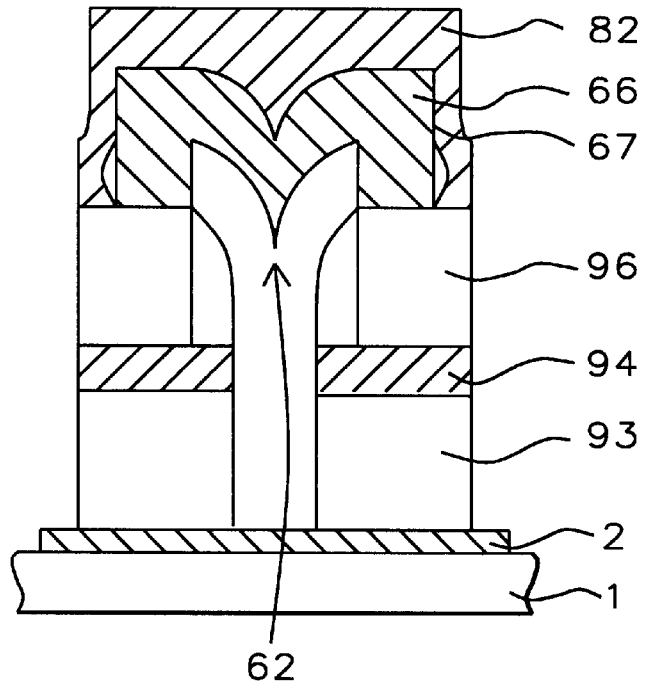
FIG. 9 is am alternative embodiment of the invention that employs one less dielectric layer.

A second embodiment of the invention is illustrated in FIG. 9. It is generally similar to the first embodiment discussed in detail above, the major difference being that one less layer of dielectric material is needed. This reduces the cost of the embodiment at the price of reducing the ease with which the distance between microtip 62 and gate layer 94 can be adjusted. In the first embodiment, the microtip to gate distance was most conveniently varied by changing the thickness of second dielectric layer 5. In this embodiment, control is achieved by changing the thickness of silicon nitride layer 96. Best results can be achieved if dielectric layer 93 is between about 0.45 and 0.5 microns thick, if polysilicon layer 94 (preferably heavily doped) is between about 0.1 and 0.55 microns thick, and if silicon nitride layer 96 is between about 0.5 and 0.55 microns thick.

Figure 5:
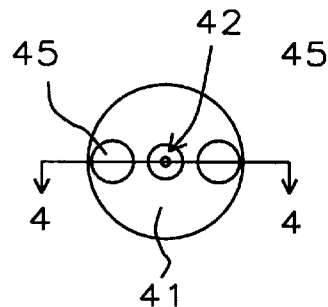
Figure 10:
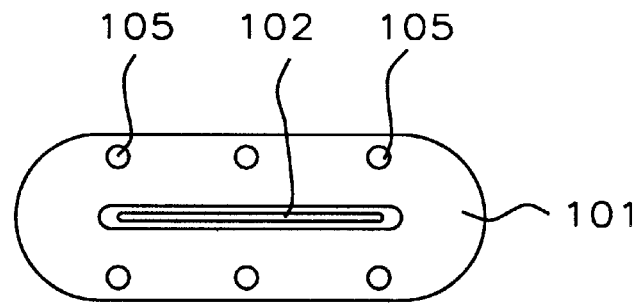
FIGS. 10 and 11 illustrate an alternative embodiment of the invention wherein the emitter is a micro razor edge rather than a microtip.
Figure 11:
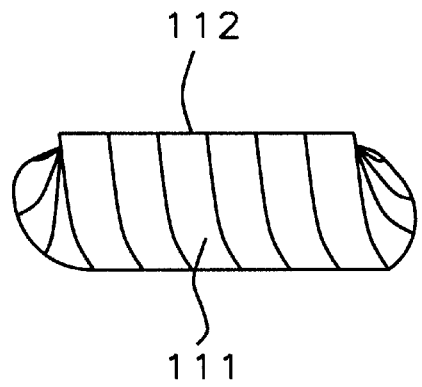

In a third embodiment of the invention, two dielectric layers are used, as in the first embodiment, but the shape of the cold emitter is changed from a micro tip to a micro razor edge. This is achieved by etching a sausage shaped hole (a rectangle with the shorter sides rounded) in the silicon nitride prior to the formation of the spacer on the vertical wall of the hole. A plan view, analogous to the plan view of FIG. 5, is shown in FIG. 10. Six pole holes 105 are shown in the drawing but the invention could still work with as many as poles as there is room for and as few as a single pole. When the sausage shaped hole is filled by the sacrificial layer, line 102 (typically between about 5 and 10 microns long), rather than a point, is formed at the bottom of depression 101. FIG. 11 is a stereo view of the razor edge 112 which terminates emitter 111. The support poles are not shown in this case. While occupying somewhat more space than a microtip, a micro razor edge contains many more emission points than a microtip, making it more efficient (with a lower impedance) as a cold cathode.

In a fourth embodiment of the invention, the second and third embodiments have been combined, resulting in a structure that has a micro razor edge as its emitter and uses only one dielectric layer (other the silicon nitride).

In conclusion we note that the above described structure and process may be readily extended to include additional layers of polysilicon separated by additional layers of dielectric. The motive for doing so would generally be to introduce additional control gates thereby modifying the I-V characteristics of the device.

We also note here that for all the embodiments described above the lifetime of the tip can be extended by introducing an extra process step, namely the deposition of a suitable protective coating over the tip. Such coatings are thin films of materials such as silicon carbide, diamond, doped diamond, carbon nitride (family), carbon 60, etc.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a micro vacuum tube, comprising the steps of:

patterning and etching a first conductive layer to form a first disk, having a first diameter;

onto said first disk, successively depositing a first layer of a dielectric, a second conductive layer, a second layer of a dielectric, and a layer of silicon nitride having a top surface;

patterning and etching the layers on said first disk to form a pedestal having a second diameter that is less than said first diameter;

in the silicon nitride, forming a circular hole having a vertical wall that extends as far as said second dielectric layer;

on said vertical wall, forming a silicon nitride spacer having a thickness value that varies from maximum furthest from said top surface to zero at said top surface;

using the spacer as a mask, etching the second dielectric, the second conductive layer, and the first dielectric down as far as said first conductive layer;

depositing a sacrificial layer onto said top surface and into said hole, thereby forming a concave cusp having a central depression and an outer rim;

patterning and etching said sacrificial layer to form a pole hole, extending to said top surface and located between said central depression and said outer rim;

depositing a third conductive layer over the sacrificial layer to a thickness sufficient to overfill the pole hole and the central depression;

patterning and etching said third conductive layer to form a second disk that includes the pole hole and having a diameter that is less than said second diameter;

selectively removing the sacrificial layer thereby forming a microtip having a top surface and comprising a conductive convex cusp centrally located above the circular hole and supported by a conductive pole; and in a vacuum environment, depositing a metal layer that extends from the top surface of the silicon nitride to the top surface of the microtip.

2. The process of claim 1 wherein said first, second and third conductive layers further comprise polysilicon or a metal.

3. The process of claim 1 further comprising between 2 and as many pole holes as there is space for.

4. The process of claim 1 further comprising the step of depositing a protective coating over the tip, said coating being a thin film of material selected from the group consisting of silicon carbide, diamond, doped diamond, the carbon nitride family, and carbon 60.

5. The process of claim 1 wherein depth of the pole hole has no upper or lower limit.

6. The process of claim 1 wherein the maximum thickness of the silicon nitride spacer is unlimited.

7. A process for manufacturing a micro vacuum tube, comprising the steps of:

patterning and etching a first conductive layer to form a first disk, having a first diameter;

onto said first disk, successively depositing a layer of a dielectric, a second conductive layer, and a layer of silicon nitride having a top surface;

patterning and etching the layers on said first disk to form a pedestal having a second diameter that is less than said first diameter;

in the silicon nitride, forming a circular hole having a vertical wall that extends as far as the dielectric layer;

on said vertical wall, forming a silicon nitride spacer having a thickness value that varies from maximum furthest from said top surface to zero at said top surface;

using the spacer as a mask, etching the second conductive layer, and the first dielectric down as far as said first conductive layer;

depositing a sacrificial layer onto said top surface and into said hole, thereby forming a concave cusp having a central depression and an outer rim;

patterning and etching said sacrificial layer to form a pole hole, extending to said top surface and located between said central depression and said outer rim;

depositing a third conductive layer over the sacrificial layer to a thickness sufficient to overfill the pole hole and the central depression;

patterning and etching said third conductive layer to form a second disk that includes the pole hole and having a diameter that is less than said second diameter;

selectively removing the sacrificial layer thereby forming a microtip having a top surface and comprising a conductive convex cusp centrally located above the circular hole and supported by a conductive pole; and in a vacuum environment, depositing a metal layer that extends from the top surface of the silicon nitride to the top surface of the microtip.

8. The process of claim 7 wherein said first, second and third conductive layers further comprise polysilicon or a metal.

9. The process of claim 7 wherein the sacrificial layer is SACVD oxide or BPTEOS oxide and it is selectively etched by using wet etching or vapor etching.

10. A process for manufacturing a micro vacuum tube, comprising the steps of:

patterning and etching a first conductive layer to form a first disk, having a first diameter;

onto said first disk, successively depositing a first layer of a dielectric, a second conductive layer, a second layer of dielectric and a layer of silicon nitride having a top surface;

patterning and etching the layers on said first disk to form a pedestal having a second diameter that is less than said first diameter;

in the silicon nitride, forming a sausage-shaped hole having a vertical wall that extend as far as said second dielectric layer;

on said vertical wall, forming a silicon nitride spacer having a thickness value that varies from maximum furthest from said top surface to zero at said top surface;

using the spacer as a mask, etching the second dielectric, the second conductive layer, and the first dielectric down as far as said first conductive layer;

depositing a sacrificial layer onto said top surface and into said hole, thereby forming a sausage shaped depression having a cusp cross-section, and an outer rim;

patterning and etching said sacrificial layer to form a pole hole, extending to said top surface and located between said depression and said outer rim;

depositing a third conductive layer over the sacrificial layer to a thickness sufficient to overfill the pole hole and the depression;

patterning and etching said third conductive layer to form a second disk that includes the pole hole and having a diameter that is less than said second diameter;

selectively removing the sacrificial layer thereby forming a conductive micro razor edge, having a top surface, symmetrically located above the circular hole and supported by a conductive pole; and in a vacuum environment, depositing a metal layer that extends from the top surface of the silicon nitride to the top surface of the micro razor edge.

11. The process of claim 10 wherein said first, second and third conductive layers further comprise polysilicon or a metal.

12. The process of claim 10 further comprising the step of depositing a protective coating over the tip, said coating being a thin film of material selected from the group consisting of silicon carbide, diamond, doped diamond, the carbon nitride family, and carbon 60.

13. A process for manufacturing a micro vacuum tube, comprising the steps of:

patterning and etching a first conductive layer to form a first disk, having a first diameter;

onto said first disk, successively depositing a layer of a dielectric, a second conductive layer, and a layer of silicon nitride having a top surface;

patterning and etching the layers on said first disk to form a pedestal having a second diameter that is less than said first diameter;

in the silicon nitride, forming a sausage-shaped hole having a vertical wall that extends as far as said second conductive layer;

on said vertical wall, forming a silicon nitride spacer having a thickness value that varies from maximum furthest from said top surface to zero at said top surface;

using the spacer as a mask, etching the second conductive layer and the dielectric layer down as far as said first conductive layer;

depositing a sacrificial layer onto said top surface and into said hole, thereby forming a sausage shaped depression, having a cusp cross-section, and an outer rim;

patterning and etching said sacrificial layer to form a pole hole, extending to said top surface and located between said depression and said outer rim;

depositing a third conductive layer over the sacrificial layer to a thickness sufficient to overfill the pole hole and the depression;

patterning and etching said third conductive layer to form a second disk that includes the pole hole and having a diameter that is less than said second diameter;

selectively removing the sacrificial layer thereby forming a conductive micro razor edge, having a top surface, symmetrically located above the circular hole and supported by a conductive pole; and in a vacuum environment, depositing a metal layer that extends from the top surface of the silicon nitride to the top surface of the micro razor edge.

14. The process of claim 13 wherein said first, second and third conductive layers further comprise polysilicon or a metal.

15. The process of claim 13 further comprising the step of depositing a protective coating over the tip, said coating being a thin film of material selected from the group consisting of silicon carbide, diamond, doped diamond, the carbon nitride family, and carbon 60.

* * * * *